(12) United States Patent
Matsumoto et al.

(10) Patent No.: US 10,633,737 B2
(45) Date of Patent: Apr. 28, 2020

(54) DEVICE FOR ATOMIC LAYER DEPOSITION

(71) Applicant: THE JAPAN STEEL WORKS, LTD., Shinagawa-ku, Tokyo (JP)

(72) Inventors: Tatsuya Matsumoto, Kanagawa (JP); Keisuke Washio, Kanagawa (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 342 days.

(21) Appl. No.: 15/575,358

(22) PCT Filed: Apr. 19, 2016

(86) PCT No.: PCT/JP2016/062400
§ 371 (c)(1),
(2) Date: Nov. 18, 2017

(87) PCT Pub. No.: WO2016/190005
PCT Pub. Date: Dec. 1, 2016

(65) Prior Publication Data
US 2018/0155823 A1     Jun. 7, 2018

(30) Foreign Application Priority Data
May 26, 2015   (JP) ................................. 2015-106856

(51) Int. Cl.
*C23C 16/04*     (2006.01)
*C23C 16/455*    (2006.01)
(Continued)

(52) U.S. Cl.
CPC .......... *C23C 16/042* (2013.01); *C23C 14/564* (2013.01); *C23C 16/308* (2013.01);
(Continued)

(58) Field of Classification Search
CPC ............ C23C 16/042; C23C 16/45525; C23C 16/45536; C23C 16/45544; C23C 16/458
See application file for complete search history.

(56) References Cited

U.S. PATENT DOCUMENTS

| 4,793,283 | A | 12/1988 | Sarkozy |
| 5,044,314 | A | 9/1991 | McNeilly |

(Continued)

FOREIGN PATENT DOCUMENTS

| CN | 101356630 A | 1/2009 |
| JP | 61163279 A | 7/1986 |

(Continued)

OTHER PUBLICATIONS

Miercuk, M.J., et al., "Low-temperature atomic-layer-deposition lift-off method for microelectronic and nanoelectronic applications". Applied Physics Letters, vol. 83, No. 12, Sep. 22, 2003, pp. 2405-2407.*

(Continued)

*Primary Examiner* — Bret P Chen
(74) *Attorney, Agent, or Firm* — Holtz, Holtz & Volek PC

(57) ABSTRACT

A device for atomic layer deposition includes: a film deposition chamber; a stage installed inside the film deposition chamber; a susceptor that holds, on the stage, a substrate; a mask disposed on the substrate, the mask being sized to encompass the substrate; a mask pin that supports the mask; and a mask pin hole bored through the stage and the susceptor vertically, and allows the mask pin to be inserted in a vertically movable manner, wherein the susceptor has a susceptor body having a holding surface of the substrate, and a susceptor peripheral edge located around the susceptor body and having a height lower than the holding surface, the mask pin hole is opened in the susceptor peripheral edge, and in the susceptor peripheral edge, an inert gas supply port (Continued)

that releases gas upward is provided around the holding surface in a surrounding area of the mask.

8 Claims, 7 Drawing Sheets

(51) Int. Cl.
    *C23C 16/509*     (2006.01)
    *C23C 16/44*     (2006.01)
    *C23C 16/30*     (2006.01)
    *C23C 14/56*     (2006.01)
    *C23C 16/458*     (2006.01)
    *H01L 21/02*     (2006.01)
    *H01L 21/687*     (2006.01)

(52) U.S. Cl.
    CPC ...... *C23C 16/4405* (2013.01); *C23C 16/4412* (2013.01); *C23C 16/458* (2013.01); *C23C 16/4557* (2013.01); *C23C 16/4558* (2013.01); *C23C 16/4585* (2013.01); *C23C 16/45521* (2013.01); *C23C 16/45536* (2013.01); *C23C 16/45544* (2013.01); *C23C 16/45565* (2013.01); *C23C 16/509* (2013.01); *H01L 21/0228* (2013.01); *H01L 21/02178* (2013.01); *H01L 21/02208* (2013.01); *H01L 21/02274* (2013.01); *H01L 21/68735* (2013.01); *H01L 21/68742* (2013.01)

(56) References Cited

U.S. PATENT DOCUMENTS

| | | | |
|---|---|---|---|
| 5,222,074 A | 6/1993 | Uchiyama et al. | |
| 5,291,536 A * | 3/1994 | Itoh | G03F 1/46 378/34 |
| 5,326,725 A | 7/1994 | Sherstinsky et al. | |
| 5,338,363 A | 8/1994 | Kawata et al. | |
| 5,405,446 A | 4/1995 | Nakajima et al. | |
| 5,457,298 A | 10/1995 | Nelson et al. | |
| 5,534,073 A | 7/1996 | Kinoshita et al. | |
| 5,567,243 A | 10/1996 | Foster et al. | |
| 5,578,132 A | 11/1996 | Yamaga et al. | |
| 5,632,820 A | 5/1997 | Taniyama et al. | |
| 5,643,394 A | 7/1997 | Maydan et al. | |
| 5,732,298 A * | 3/1998 | Nishizawa | G03B 13/10 396/380 |
| 5,772,770 A | 6/1998 | Suda et al. | |
| 5,788,799 A | 8/1998 | Steger et al. | |
| 5,916,455 A | 6/1999 | Kumagai | |
| 5,922,100 A | 7/1999 | Cain et al. | |
| 5,935,283 A | 8/1999 | Sweeney et al. | |
| 5,972,116 A | 10/1999 | Takagi | |
| 5,992,463 A | 11/1999 | Redemann et al. | |
| 5,997,651 A | 12/1999 | Matsuse et al. | |
| 6,010,919 A * | 1/2000 | Matsuhiro | B81C 1/00626 257/E21.256 |
| 6,194,037 B1 | 2/2001 | Terasaki et al. | |
| 6,200,389 B1 | 3/2001 | Miller et al. | |
| 6,248,672 B1 | 6/2001 | Takagi | |
| 6,293,310 B1 | 9/2001 | Redemann et al. | |
| 6,410,102 B1 | 6/2002 | Hashizume et al. | |
| 6,527,911 B1 | 3/2003 | Yen et al. | |
| 6,733,593 B1 | 5/2004 | Tanaka et al. | |
| 7,354,622 B2 | 4/2008 | Shinriki et al. | |
| 7,635,501 B2 | 12/2009 | Komai et al. | |
| 8,430,960 B2 | 4/2013 | Sumakeris et al. | |
| 8,454,749 B2 | 6/2013 | Li | |
| 8,506,713 B2 | 8/2013 | Takagi | |
| 8,539,908 B2 | 9/2013 | Takagi | |
| 8,764,902 B2 | 7/2014 | Suzuki et al. | |
| 8,851,886 B2 | 10/2014 | Morita et al. | |
| 9,540,731 B2 | 1/2017 | Noorbakhsh et al. | |
| 9,767,993 B2 | 9/2017 | Ishibashi et al. | |
| 9,777,371 B2 | 10/2017 | Coutu et al. | |
| 9,988,717 B2 | 6/2018 | Honma | |
| 10,167,557 B2 | 1/2019 | Hawkins et al. | |
| 2002/0023589 A1 | 2/2002 | Kondo et al. | |
| 2002/0108711 A1 | 8/2002 | Kim | |
| 2002/0122885 A1 | 9/2002 | Ahn | |
| 2002/0168854 A1 | 11/2002 | Tometsuka | |
| 2002/0182876 A1 | 12/2002 | Kawai | |
| 2003/0041802 A1 | 3/2003 | Tanaka et al. | |
| 2003/0124842 A1 | 7/2003 | Hytros et al. | |
| 2003/0132319 A1 | 7/2003 | Hytros et al. | |
| 2003/0136365 A1 | 7/2003 | Komai et al. | |
| 2003/0150560 A1 | 8/2003 | Kinnard et al. | |
| 2003/0207032 A1 | 11/2003 | Ahn et al. | |
| 2003/0213560 A1 | 11/2003 | Wang et al. | |
| 2004/0154537 A1 | 8/2004 | Chon et al. | |
| 2005/0061442 A1 | 3/2005 | Higashiura | |
| 2006/0021574 A1 | 2/2006 | Armour et al. | |
| 2006/0096540 A1 | 5/2006 | Choi | |
| 2006/0174833 A1 | 8/2006 | Yamazaki et al. | |
| 2006/0185590 A1 | 8/2006 | Schaepkens et al. | |
| 2006/0225655 A1 | 10/2006 | Faguet et al. | |
| 2006/0280868 A1 | 12/2006 | Kato et al. | |
| 2007/0022954 A1 | 2/2007 | Iizuka et al. | |
| 2007/0051312 A1 | 3/2007 | Sneh | |
| 2007/0095284 A1 | 5/2007 | Iizuka et al. | |
| 2007/0158026 A1 | 7/2007 | Amikura | |
| 2007/0218702 A1 * | 9/2007 | Shimizu | C23C 16/06 438/758 |
| 2008/0075858 A1 * | 3/2008 | Koh | C23C 16/06 427/255.28 |
| 2008/0173366 A1 | 7/2008 | Kwon | |
| 2008/0206987 A1 | 8/2008 | Gelatos et al. | |
| 2008/0261074 A1 | 10/2008 | Shishikura | |
| 2009/0038548 A1 | 2/2009 | Iizuka et al. | |
| 2009/0173444 A1 | 7/2009 | Sago et al. | |
| 2009/0250008 A1 | 10/2009 | Matsushima et al. | |
| 2009/0277389 A1 | 11/2009 | Kakimoto | |
| 2010/0047447 A1 | 2/2010 | Cook | |
| 2010/0186673 A1 | 7/2010 | Tanaka et al. | |
| 2010/0210092 A1 | 8/2010 | You et al. | |
| 2010/0272895 A1 | 10/2010 | Tsuda | |
| 2010/0298738 A1 | 11/2010 | Felts et al. | |
| 2010/0322754 A1 * | 12/2010 | Lee | C23C 16/042 414/749.6 |
| 2011/0036291 A1 | 2/2011 | Jauhiainen et al. | |
| 2011/0174441 A1 | 7/2011 | Yamashita et al. | |
| 2011/0212625 A1 | 9/2011 | Toyoda et al. | |
| 2011/0214611 A1 * | 9/2011 | Kato | C23C 16/45519 118/719 |
| 2011/0303147 A1 | 12/2011 | Tachibana et al. | |
| 2011/0305836 A1 | 12/2011 | Murata et al. | |
| 2012/0031748 A1 | 2/2012 | Ishihara | |
| 2012/0064245 A1 | 3/2012 | Coutu et al. | |
| 2012/0098146 A1 * | 4/2012 | Lee | C23C 16/042 257/787 |
| 2013/0287376 A1 * | 10/2013 | Lim | H01L 21/67115 392/411 |
| 2014/0008352 A1 | 1/2014 | Uemura et al. | |
| 2014/0083615 A1 | 3/2014 | Kim et al. | |
| 2014/0090599 A1 | 4/2014 | Saitou | |
| 2014/0209015 A1 | 7/2014 | Yamada et al. | |
| 2014/0225503 A1 * | 8/2014 | Mori | H01J 37/32183 315/111.21 |
| 2014/0239091 A1 | 8/2014 | Huang et al. | |
| 2014/0262034 A1 | 9/2014 | Ishibashi et al. | |
| 2014/0366804 A1 * | 12/2014 | Pak | C23C 16/45551 118/718 |
| 2015/0004798 A1 | 1/2015 | Chandrasekharan et al. | |
| 2015/0024609 A1 | 1/2015 | Milligan et al. | |
| 2015/0136326 A1 * | 5/2015 | Mantani | B41F 15/16 156/387 |
| 2015/0184289 A1 * | 7/2015 | Lee | C23C 16/52 427/255.5 |
| 2015/0267299 A1 | 9/2015 | Hawkins et al. | |
| 2016/0027675 A1 * | 1/2016 | Ravid | H01L 21/67259 118/713 |
| 2016/0148801 A1 | 5/2016 | Yabe et al. | |

(56) References Cited

U.S. PATENT DOCUMENTS

| | | | |
|---|---|---|---|
| 2016/0319422 A1* | 11/2016 | Kurita | H01L 51/5253 |
| 2017/0101710 A1 | 4/2017 | Chandrasekharan et al. | |
| 2018/0315626 A1 | 11/2018 | Franklin | |
| 2019/0048463 A1 | 2/2019 | Toramaru et al. | |
| 2019/0177842 A1 | 6/2019 | Washio et al. | |
| 2019/0211448 A1 | 7/2019 | Washio et al. | |

FOREIGN PATENT DOCUMENTS

| | | | |
|---|---|---|---|
| JP | 63076880 A | 4/1988 | |
| JP | 01183113 A | 7/1989 | |
| JP | 06140379 A | 5/1994 | |
| JP | 07201754 A | 8/1995 | |
| JP | 08186081 A | 7/1996 | |
| JP | 09115993 A | 5/1997 | |
| JP | 11335849 A | 12/1999 | |
| JP | 2000208439 A | 7/2000 | |
| JP | 2000243711 A | 9/2000 | |
| JP | 2002302770 A | 10/2002 | |
| JP | 2003068657 A | 3/2003 | |
| JP | 2004339581 A | 12/2004 | |
| JP | 2006080148 A | 3/2006 | |
| JP | 2006351655 A | 12/2006 | |
| JP | 2007281150 A | 10/2007 | |
| JP | 2009062579 A | 3/2009 | |
| JP | 2010212433 A | 9/2010 | |
| JP | 2010212434 A | 9/2010 | |
| JP | 2012052221 A | 3/2012 | |
| JP | 2012126977 A | 7/2012 | |
| JP | 2012175055 A | 9/2012 | |
| JP | 2014192379 A | 10/2014 | |
| JP | 2015073019 A | 4/2015 | |
| JP | 2015073020 A | 4/2015 | |
| JP | 2015073021 A | 4/2015 | |
| KR | 1020080098687 A | 11/2008 | |
| KR | 101028605 B1 | 4/2011 | |
| TW | 366517 B | 8/1999 | |
| TW | 457524 B | 10/2001 | |
| WO | WO 99/67440 | * 12/1999 | C23C 16/44 |
| WO | 0042235 A1 | 7/2000 | |
| WO | 2007116940 A1 | 10/2007 | |

OTHER PUBLICATIONS

Lamagna, Luca, et al., "Mechanisms for Substrate-Enhanced Growth during the Early Stages of Atomic Layer Deposition of Alumina onto Silicon Nitride Surfaces". Chemistry of Materials, 2012, 24, 1080-1090.*

Sinha, Ashwini, et al., "Area-Selective ALD of Titanium Dioxide Using Lithographically Defined Poly(methyl methacrylate) Films". Journal of the Electrochemical Society, 153 (5) G465-G469, 2006.*

Han, Zhongmei, et al., "Metal oxide multilayer hard mask system for 3D nanofabrication". Nanotechnology 29 (2018), 055301, pp. 1-8.*

International Search Report (ISR) and Written Opinion dated Aug. 2, 2016 issued in International Application No. PCT/JP2016/062400.

Notice of Allowance dated Aug. 26, 2019 issued in U.S. Appl. No. 15/575,357.

Notice of Allowance dated Aug. 28, 2019 issued in U.S. Appl. No. 15/575,360.

Office Action (Non-Final Rejection) dated Aug. 20, 2019 issued in U.S. Appl. No. 15/575,359.

English translation of the International Preliminary Report on Patentability dated Dec. 7, 2017 issued in counterpart International Application No. PCT/JP2016/062400.

Related U.S. Appl. No. 15/575,357; First Named Inventor: Tatsuya Matsumoto; Title: "Device for Atomic Layer Deposition"; filed Nov. 18, 2017.

Related U.S. Appl. No. 15/575,359; First Named Inventor: Tatsuya Matsumoto; Title: "Atomic Layer Growth Device and Atomic Layer Growth Device Exhaust Unit"; filed Nov. 18, 2017.

Related U.S. Appl. No. 15/575,360; First Named Inventor: Tatsuya Matsumoto; Title: Apparatus for Plasma Atomic Layer Deposition; filed Nov. 18, 2017.

Chinese Office Action dated Jan. 2, 2020 (and English translation thereof) issued in Chinese Application No. 201680031264.0.

* cited by examiner

DEVICE FOR ATOMIC LAYER DEPOSITION

TECHNICAL FIELD

The present invention relates to a device for atomic layer deposition that forms a thin film on a substrate.

BACKGROUND ART

An atomic layer deposition method is a method for forming a thin film on a substrate on an atomic layer basis by alternately supplying, on the substrate, gases of elements constituting the thin film to be formed to, and is known as a technique for uniformly forming a thin film. The atomic layer deposition method is excellent in step coverage and film thickness controllability, compared to a general CVD (Chemical Vapor Deposition) method.

In a conventional sputtering film deposition device, a mask can be utilized, as described in Patent Literature 1. In sputtering film deposition, step coverage of a film is low, and therefore an amount of film deposition on a back side of a mask is small. Accordingly, a particle generation amount is small, and a maintenance cycle is also long. However, in atomic layer deposition method, step coverage of a film is high, and therefore an amount of film deposition on a back side of a mask is large. Gas that enters a micro clearance becomes a thick film and powder, which causes particles. Particularly, surface roughness of a mask cannot be increased in order to maintain flatness of the mask, and therefore replacement frequency of the mask is increased.

Therefore, in the atomic layer deposition method using a mask, inert gas purge from a periphery of a susceptor is effective. In Patent Literature 2, a gas supply port is provided in a stage, and inert gas is supplied from a back side of a susceptor.

CITATION LIST

Patent Literature

[Patent Literature 1]
 Japanese Patent Laid-Open No. 2004-339581
[Patent Literature 2]
 Japanese Patent Laid-Open No. 2000-243711

SUMMARY OF INVENTION

Technical Problem

However, when a gas supply port is provided in a stage body in accordance with a device described in Patent Literature 2, design and manufacture of the stage becomes complicated. Accordingly, in a case where substrate size is changed, configuration of the stage itself needs to be changed, and therefore there is a problem that versatility is low.

The present invention has been made in view of a background of the above circumstances, and an object of the invention is to provide a device for atomic layer deposition capable of suppressing film adhesion on a back side of a mask and easily coping with change in the substrate size.

Solution to Problem

In a device for atomic layer deposition of the present invention, a first aspect is a device for atomic layer deposition that forms a thin film on a substrate, the device for atomic layer deposition including: a film deposition chamber; a stage that is installed inside the film deposition chamber; a susceptor that holds, on the stage, the substrate; a mask that is disposed on the substrate, the mask being sized to encompass the substrate; a mask pin that supports the mask, and is movable upward and downward; and a mask pin hole that is bored through the stage and the susceptor in a vertical direction, and allows the mask pin to be inserted in movable up and down manner, wherein the susceptor has a susceptor body having a holding surface of the substrate, and a susceptor peripheral edge located around the susceptor body, the susceptor peripheral edge having a height lower than the holding surface, the mask pin hole is opened in the susceptor peripheral edge, and in the susceptor peripheral edge, an inert gas supply port that releases gas upward is provided around the holding surface in a surrounding area of the mask, and an inert gas supply path for supplying inert gas is connected to the inert gas supply port.

According to a present invention of a device for atomic layer deposition of a second aspect, in the present invention of the above aspect, the inert gas supply port is provided outward from the mask pin hole with respect to the susceptor body.

According to a present invention of a device for atomic layer deposition of a third aspect, in the present invention of the above aspect, the inert gas supply port is formed at a plurality of places along an entire circumference around the holding surface or continuously formed over the entire circumference.

According to a present invention of a device for atomic layer deposition of a fourth aspect, in the present invention of the above aspect, the inert gas supply port has a shower head structure for the inert gas supply path.

According to a present invention of a device for atomic layer deposition of a fifth aspect, in the present invention of the above aspect, a clearance formed between the mask and the susceptor peripheral edge is not less than 0.1 mm and not more than 10 mm.

According to a present invention of a device for atomic layer deposition of a sixth aspect, in the present invention of the above aspect, a distance between a peripheral end of the mask and an adjacent side of the inert gas supply port is not less than 1 mm and not more than 200 mm.

According to a present invention of a device for atomic layer deposition of a seventh aspect, in the present invention of the above aspect, an adhesion preventive member is installed on an upper surface of the susceptor peripheral edge.

According to a present invention of a device for atomic layer deposition of an eighth aspect, in the present invention of the above aspect, the inert gas having a temperature within ±10% of a stage surface temperature is released from the inert gas supply port.

Advantageous Effects of Invention

According to the present invention, it is possible to suppress film adhesion on a back side of a mask, and easily cope with change in substrate size, and therefore cleaning frequency of the mask and a susceptor can be reduced, and coping with various substrate sizes and process conditions is possible.

DESCRIPTION OF EMBODIMENTS

Figure 1:
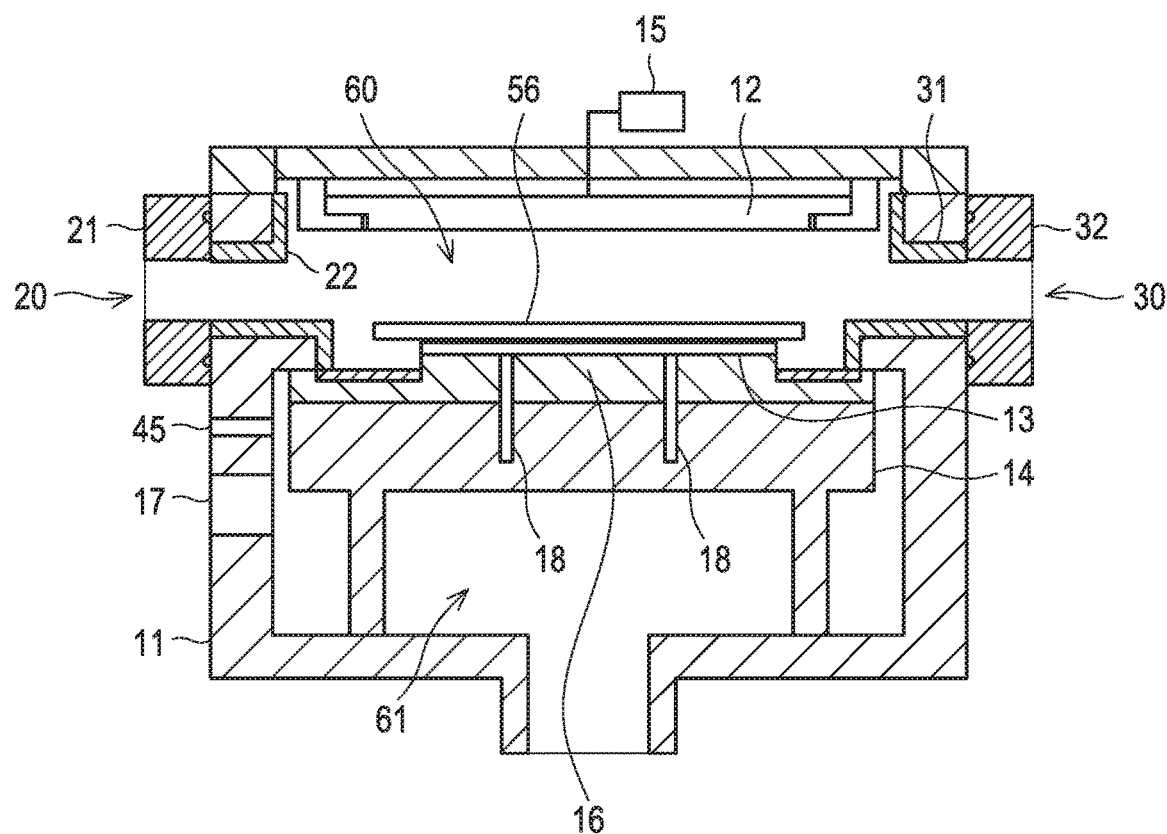
FIG. 1 is a schematic configuration diagram of a partially omitted device for atomic layer deposition of an embodiment of the present invention.

First, a configuration of a device for atomic layer deposition of this embodiment will be described with reference to FIG. 1. FIG. 1 is a schematic configuration diagram illustrating an example of the device for atomic layer deposition of this embodiment.

A device for atomic layer deposition 10 of this embodiment alternately supplies raw material gas and reactant gas to form a thin film on a substrate 13 on an atomic layer basis. At this time, the substrate 13 can be heated in order to enhance reaction activity. TMA (Tri-Methyl Aluminum) is used as the raw material gas in this embodiment, and at this time, plasma is generated in order to enhance reaction activity. Although parallel plate electrodes are used for generation of plasma in this embodiment, the present invention is not limited to this method.

A film deposition chamber 11 includes a gas introduction section 20 that introduces raw material gas, reactant gas, and purge gas, an exhaust section 30, a stage 14, a plate electrode 12, a high frequency power supply 15, a susceptor 16, a substrate carrying-in port 17, and a mask 56 disposed on the substrate 13. The gas introduction section 20 has an injector 21 provided from the outside of the film deposition chamber 11, and an injector adhesion preventive member 22 provided from the inside of the film deposition chamber 11, and the exhaust section 30 has an exhaust adhesion preventive member 31 provided from the inside of the film deposition chamber 11, and an exhaust piping connection section 32 provided from the outside of the film deposition chamber 11.

The stage 14 includes a heater (not illustrated), and can adjust the temperature of the substrate 13. For example, in a case of plasma atomic layer deposition method, the substrate 13 is heated to 50 to 200° C.

The plate electrode 12 is connected to the high frequency power supply 15. The high frequency power supply 15 supplies a high-frequency current of a predetermined frequency, so that plasma is generated between the plate electrode 12 and the stage 14.

The substrate 13 is supported by lift pins 18 from below the stage 14. The lift pins 18 enable delivery of the substrate 13 in a conveyance chamber space 61 by rising and lowering of the stage 14.

The gas introduction section 20 that introduces raw material gas, reactant gas, and purge gas supplies raw material gas, reactant gas, and purge gas into the film deposition chamber 11. The exhaust section 30 exhausts the raw material gas, the reactant gas, and the purge gas from the film deposition chamber 11 to the outside.

FIG. 1 illustrates a basic structure of the device for atomic layer deposition, and a partial configuration described below is omitted.

Embodiment 1

Figure 2:
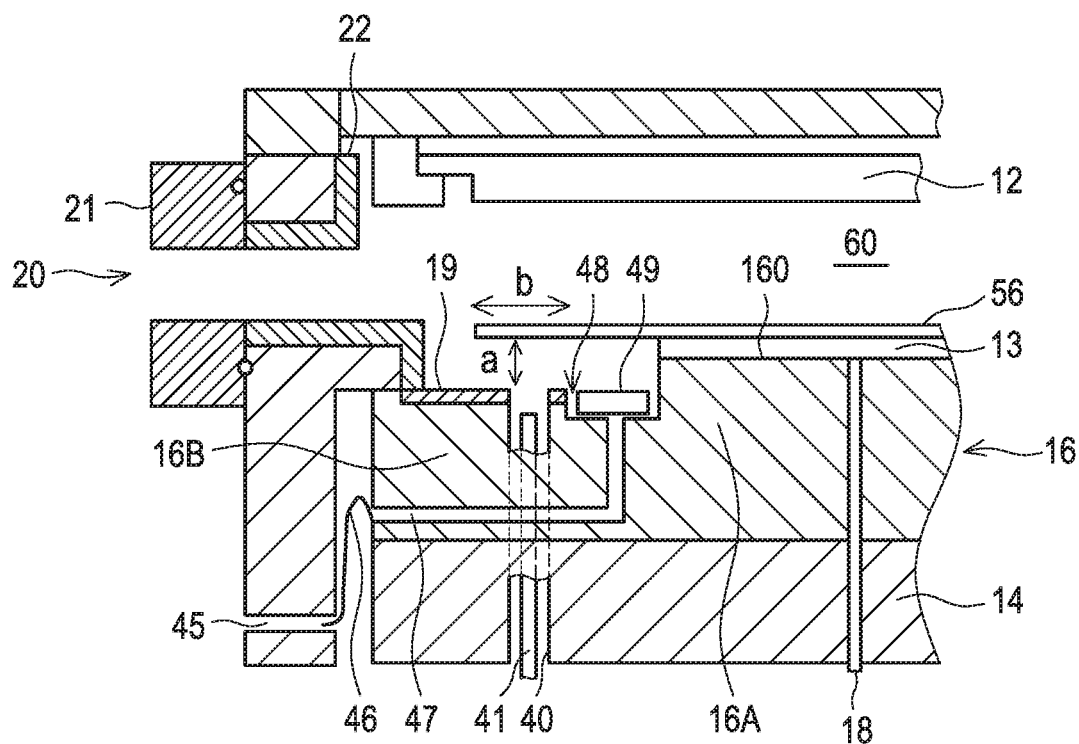
FIG. 2 is an enlarged view illustrating a periphery of a susceptor as viewed from a film deposition chamber side surface parallel to a gas flow direction, similarly.
Figure 3:
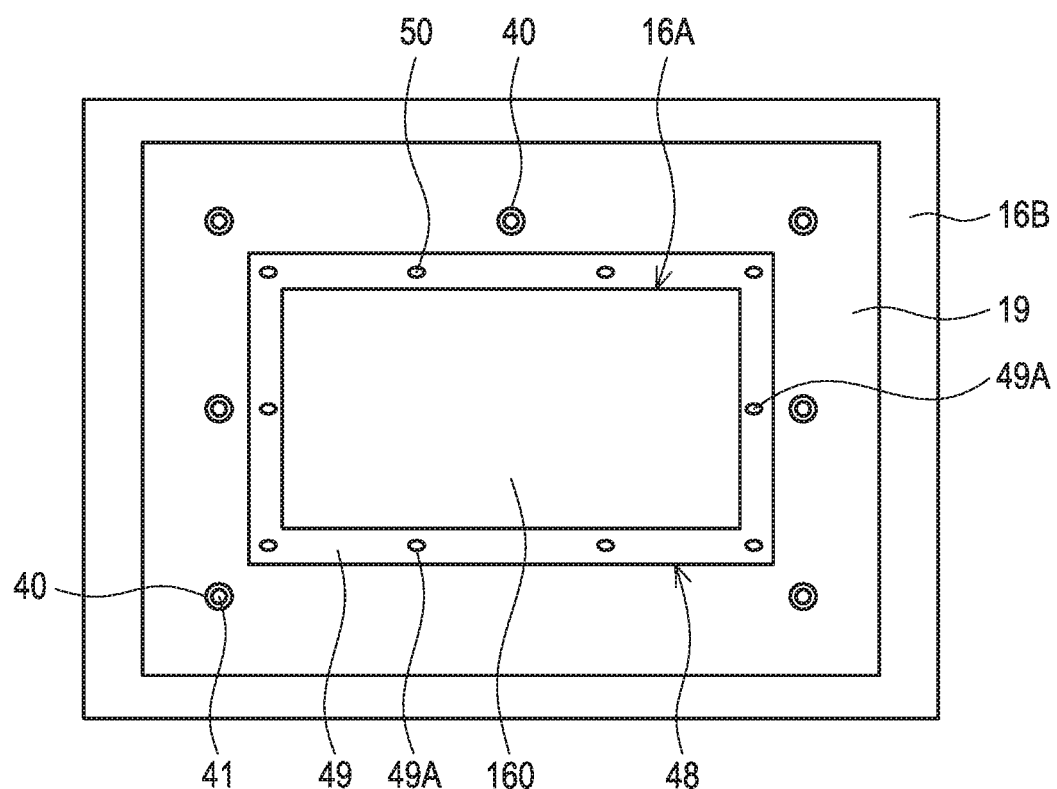
FIG. 3 is an enlarged plan view of the periphery of the susceptor, similarly.

FIG. 2 is an enlarged view of an outer periphery of the susceptor 16 as viewed from a film deposition chamber side surface parallel to a gas flow direction, and FIG. 3 is an enlarged plan view illustrating a part of a periphery of the susceptor.

The susceptor 16 is supported by the stage 14, and has a susceptor body 16A that has a holding surface 160 holding the substrate 13 on an upper surface, and a susceptor peripheral edge 16B that is located on a periphery of the susceptor body, and has a height surface lower than the holding surface 160. The holding surface 160 has a shape matching the size of the substrate 13.

The mask 56 is installed on the susceptor 16, the mask being sized to encompass the substrate 13. The size exceeding the size of the substrate 13 is not particularly limited as the present invention. However, in this embodiment, the size exceeding the size of the substrate 13 is set to 50 mm or less.

In the susceptor peripheral edge 16B, an inert gas supply port 48 is formed on an upper surface on a side near the holding surface 160, and is formed in a recessed groove shape so as to encompass the susceptor body 16A in this embodiment. Furthermore, inside the recessed groove, a ring plate-like shower plate 49 is installed so as to have a small clearance between a bottom surface of the groove and inner and outer peripheral surfaces of the groove.

The shower plate 49 is formed with discontinuous protrusions on a lower surface, for example, so that it is possible to ensure a clearance between the bottom surface of the groove and the shower plate. Additionally, the shower plate 49 is formed so as to have a width narrower than the inner and outer peripheral width of the groove, so that it is possible to form small clearances between the inner and outer peripheral surfaces of the groove and the shower plate. In the shower plate, blow-off holes 49A each having a predetermined diameter (for example, 1 mm diameter) can be formed at predetermined intervals (for example, 100 mm pitch), for example.

The shower plate 49 preferably covers the surrounding of the substrate 13.

The inert gas supply port 48 has a shower head structure by the above shower plate 49. Inert gas can be evenly blown out around the susceptor body 16A by the shower head structure.

The susceptor peripheral edge 16B has therein an inert gas supply path 47 communicated with the inert gas supply port 48, a terminal end of the inert gas supply path 47 reaches an outer peripheral wall of the susceptor peripheral edge 16B. The inert gas supply path 47 can be formed at one or a plurality of places, and can be formed to have, for example, a diameter of 3 mm.

An inert gas supply tube 46 displaced on an outer peripheral side of the susceptor 16 is connected to the inert gas supply path 47, and the other end side of the inert gas supply tube 46 is connected to an inert gas vent hole 45 provided in the film deposition chamber 11. An inert gas supply section (not illustrated) is connected to the inert gas vent hole 45.

The inert gas supply tube 46 can be composed of, for example, a tube made of stainless steel, a bellows flexible tube or the like. When the substrate 13 is carried in or out from the film deposition chamber 11, the stage 14 rises or lowers, and the inert gas supply tube 46 needs to follow the rising and lowering operation. The inert gas supply tube 46 also constitutes a part of the inert gas supply path.

In the susceptor peripheral edge 16B, mask pin holes 40 that are bored through the stage 14 and the susceptor peripheral edge 16B are formed on an outer peripheral side of the inert gas supply port 48, and mask pins 41 that are operable upward and downward, and capable of moving the mask 56 upward or downward are inserted into the mask pin holes 40.

In the susceptor peripheral edge 16B, a susceptor adhesion preventive plate 19 is covered on an exposed surface of an upper surface except the inert gas supply port 48 and the mask pin holes 40. The upper surface height of the susceptor adhesion preventive plate 19 is desirably flush with the upper surface height of the shower plate 49.

Herein, a distance "a" formed by a lower surface of the mask 56 and the upper surface of the susceptor adhesion preventive plate 19 is preferably not less than 0.1 mm and not more than 10 mm, and more preferably 1 mm. As the distance "a" is small, an amount of raw material gas and reactant gas that enter the clearance can be suppressed, and a necessary inert gas supply amount is reduced. The mask is preferably an insulating body, but can be metal such as stainless steel. However, in a case where the mask is metal, there is a possibility that electric discharge occurs in the clearance. In this case, the Paschen's law is utilized, and the pressure in the clearance is adjusted such that a product of the distance "a" and the pressure in the clearance does not satisfy an electric discharge condition.

A distance b of overlapping of an outer peripheral edge end of the mask 56 and the susceptor adhesion preventive plate 19, that is, a distance from an outer peripheral side end of the inert gas supply port 48 is preferably not less than 1 mm and not more than 200 mm, and more preferably 20 mm. In a case where the distance b is small, even when inert gas is supplied, there is a possibility that raw material gas and reactant gas enter the shower plate 49 by diffusion of the raw material gas and the reactant gas. When the value is too large, the mask and a vacuum vessel size become large, and therefore this is not preferable.

Inert gas supplied from the inert gas supply section passes through the inert gas vent hole 45, the inert gas supply tube 46, the inert gas supply path 47, and the inert gas supply port 48, and passes through the clearance between the shower plate 49 and the inert gas supply port 48, and the blow-off holes 49A via the shower plate 49 to be brown out. The inert gas passes through the clearance formed by the mask 56 and the susceptor adhesion preventive plate 19, is exhausted to the outer peripheral side of the susceptor 16, and is exhausted through the exhaust section 30.

Although the susceptor adhesion preventive plate 19 is preferably provided on the susceptor peripheral edge 16B, only the susceptor peripheral edge 16B can be provided. At this time, a distance between an upper surface of the susceptor peripheral edge 16B and the lower surface of the mask 56 is a, and a distance from an outer peripheral end of the mask 56 to an outer peripheral end side of the shower plate 49 is b.

The inert gas is preferably discharged from the inert gas supply port 48 after the inert gas is heated up to a temperature within ±10% of the stage temperature. For example, in a case where the stage is heated to 100° C., when inert gas of a normal temperature is supplied, an outer periphery of the susceptor 16 is cooled, and therefore a temperature distribution of the substrate 13 is also lowered, and film thickness uniformity and film quality uniformity are lowered. Accordingly, in order to keep the temperature of the susceptor 16 constant, for example, inert gas of 90 to 110° C. is preferably supplied.

Embodiment 2

Figure 4:
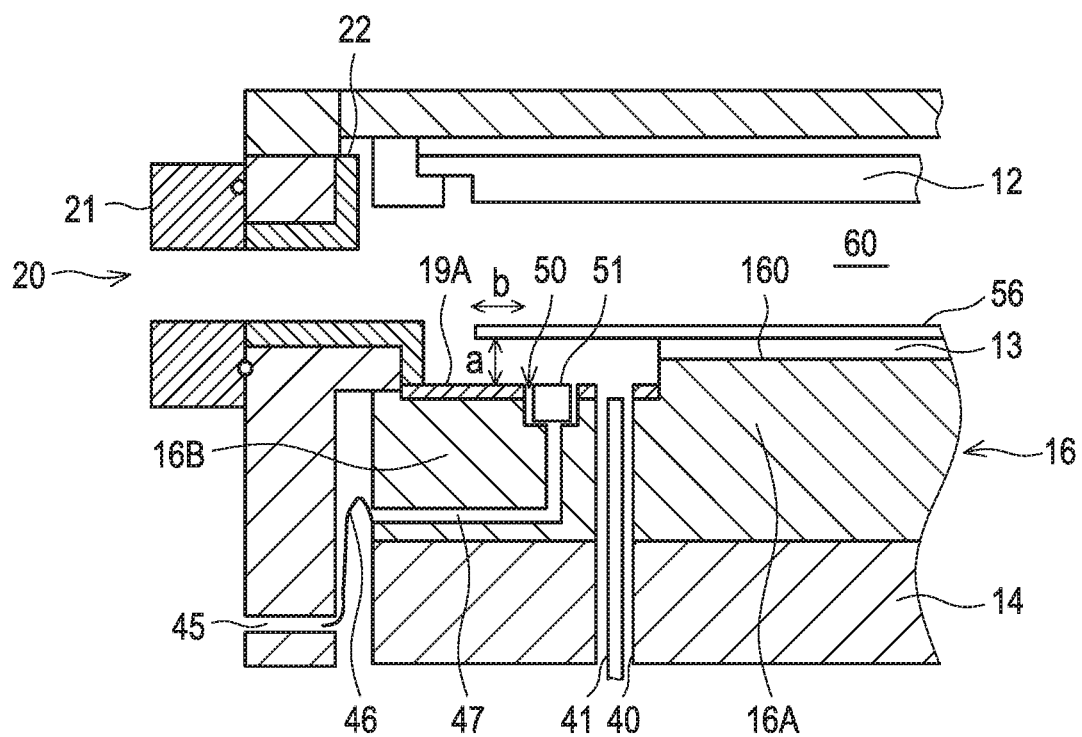
FIG. 4 is an enlarged view illustrating a periphery of a susceptor as viewed from a film deposition chamber side surface parallel to the gas flow direction, according to a device for atomic layer deposition of another embodiment.

FIG. 4 illustrates a configuration of a susceptor in which an installation position of the inert gas supply port of FIG. 2 is optimized.

In a case where the mask pin holes 40 cannot seal a film deposition space 60 and a conveyance chamber space 61 completely, when a pressure difference between the both exists, gas flows to either one of the film deposition space and the conveyance chamber space.

Generally, it is difficult to perform maintenance for the stage 14, the susceptor 16 and the conveyance chamber space 61. Accordingly, when particles are generated in these portions, removal of the particles becomes difficult. For example, when the pressure in the conveyance chamber space 61 is positive pressure, and the pressure in the film deposition space 60 is negative pressure in a state where particles exist in the mask pin holes 40, the particles ride on a gas flow to be discharged to the film deposition space 60, and the particles are adhered on the substrate 13, and therefore this is not preferable. Accordingly, the pressure in the film deposition space 60 is preferably positive pressure, and the pressure in the conveyance chamber space 61 is preferably negative pressure.

However, in a case of the susceptor structure illustrated in FIG. 2, there is a possibility that inert gas supplied from the inert gas supply port 48 is suctioned in the mask pin holes 40 depending on the pressure difference between the film deposition space 60 and the conveyance chamber space 61, and raw material gas and reactant gas are suctioned at the same time. Even in a case of the same pressure, there is a possibility that the raw material gas and the reactant gas are diffused to the mask pin holes by diffusion. The suctioned raw material gas and reactant gas react, and therefore particles are generated in the mask pin holes. Accordingly, the inert gas supply port is preferably provided on the outer peripheral side with respect to the mask pin holes 40 as in FIG. 4.

A configuration of the above device for atomic layer deposition according to the above will be described with reference to FIG. 4. A basic configuration of the device for atomic layer deposition is similar to that of the above Embodiment 1 as illustrated in FIG. 1, and the description is omitted or simplified.

Figure 5:
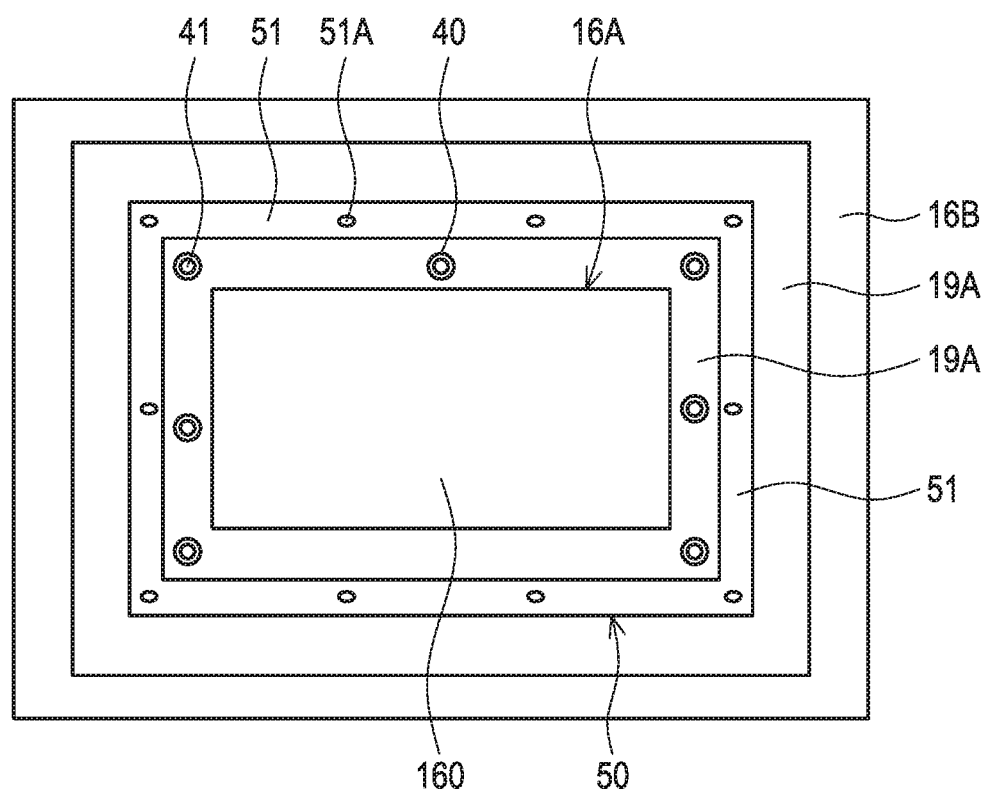
FIG. 5 is an enlarged plan view of the periphery of the susceptor, similarly.

FIG. 4 is an enlarged view of an outer periphery of a susceptor 16 as viewed from a film deposition chamber side surface parallel to the gas flow direction, and FIG. 5 is an enlarged plan view illustrating a part of a periphery of the susceptor.

Similarly to the Embodiment 1, the susceptor 16 has a susceptor body 16A that is supported by a stage 14, and has a holding surface 160 holding a substrate 13, and a susceptor peripheral edge 16B that is located on a periphery of the susceptor body, and has a height lower than the holding surface 160. The holding surface 160 has a shape matching the size of the substrate 13.

The mask 56 is installed on the susceptor 16, the mask being sized to encompass the substrate 13. The size exceeding the size of the substrate 13 is 50 mm or less, similarly to Embodiment 1.

In the susceptor peripheral edge 16B, a plurality of mask pin holes 40 that are bored through the stage 14 and the susceptor peripheral edge 16B are formed on an upper surface at a position near the holding surface 160, and mask pins 41 that are operable upward and downward, and move a mask 56 upward or downward are inserted into the mask pin holes 40.

An inert gas supply port 50 is formed on an outer peripheral side of the mask pin holes 40 with respect to the susceptor body 16A, and is formed in a recessed groove shape so as to encompass the susceptor body 16A. A shower plate 51 is installed in the recessed groove so as to have a small clearance between a bottom surface of the groove and inner and outer peripheral surfaces of the groove. The shower plate 51 is formed with discontinuous protrusions on a lower surface, for example, so that it is possible to ensure a clearance between the bottom surface of the groove and the shower plate. Additionally, in the shower plate 51, blow-off holes 51A each having a predetermined diameter (for example, 1 mm to 3 mm diameter) can be formed at predetermined intervals (for example, 10 to 200 mm pitch), for example.

The shower plate 51 preferably covers the surrounding of the substrate 13.

The inert gas supply port 50 has a shower head structure by the above shower plate 51.

In the shower head structure, a shower can be manufactured by providing blow-off holes in the susceptor peripheral edge 16B, or the shower plate can be individually manufactured to be mounted on the susceptor peripheral edge 16B.

In the susceptor peripheral edge 16B, a susceptor adhesion preventive plate 19A is covered on an exposed surface of an upper surface except the mask pin holes 40 and the inert gas supply port 50. The upper surface height of the susceptor adhesion preventive plate 19A is desirably flush with the upper surface height of the shower plate 51.

The susceptor peripheral edge 16B has therein an inert gas supply path 47 communicated with the inert gas supply port 50, a terminal end of the inert gas supply path 47 reaches an outer peripheral wall of the susceptor peripheral edge 16B. The inert gas supply path 47 can be formed at one or a plurality of places, and can be formed to have, for example, a diameter of 3 mm.

An inert gas supply tube 46 displaced on an outer peripheral side of the susceptor 16 is connected to the inert gas supply path 47, and the other end side of the inert gas supply tube 46 is connected to an inert gas vent hole 45 provided in the film deposition chamber 11. An inert gas supply section (not illustrated) is connected to the inert gas vent hole 45. The inert gas supply tube 46 can be composed of, for example, a tube made of stainless steel, a bellows flexible tube or the like.

A distance "a" formed by a lower surface of the mask 56 and the upper surface of the susceptor adhesion preventive plate 19A is preferably not less than 0.1 mm and not more than 10 mm, and more preferably 1 mm. As the distance "a" is small, an amount of raw material gas and reactant gas that enter the clearance can be suppressed, and a necessary inert gas supply amount is reduced. The mask is preferably an insulating body, but can be metal such as stainless steel. However, in a case where the mask is metal, there is a possibility that electric discharge occurs in the clearance. In this case, the Paschen's law is utilized, and the pressure in the clearance is adjusted such that a product of the distance "a" and the pressure in the clearance does not satisfy an electric discharge condition.

A distance b of overlapping of an outer peripheral edge end of the mask 56 and the susceptor adhesion preventive plate 19A, that is, a distance from an outer peripheral end of the inert gas supply port 50 is preferably not less than 1 mm and not more than 200 mm, and more preferably 20 mm. In a case where the distance b is small, even when inert gas is supplied, there is a possibility that raw material gas and reactant gas enter the shower plate 51 by diffusion of the raw material gas and the reactant gas. When the value is too large, the mask and a vacuum vessel size become large, and therefore this is not preferable.

In this embodiment, inert gas is brown out on an outer peripheral side of mask pins 40, and therefore action of suppressing diffusion of raw material gas and reactant gas is large.

Inert gas supplied from the inert gas supply section passes through the inert gas vent hole 45, the inert gas supply tube 46, the inert gas supply path 47, and the inert gas supply port 50, and passes through the clearance between the shower plate 51 and the inert gas supply port 50, and the blow-off holes 51A via the shower plate 51 to be brown out. The inert gas passes through the clearance formed by the mask 56 and the susceptor adhesion preventive plate 19A, and is supplied to an exhaust section 30.

Although the susceptor adhesion preventive plate 19A is preferably provided on the susceptor peripheral edge 16B, only the susceptor peripheral edge 16B can be provided. At this time, a distance between an upper surface of the susceptor peripheral edge 16B and the lower surface of the mask 56 is a, and a distance from an outer peripheral end of the mask 56 to an outer peripheral end side of the shower plate 51 is b.

In a case where the size of the substrate 13 is changed in each of the above embodiments, coping by change in the size of the susceptor 16 is possible, and the stage configuration does not need to be changed. When a process condition is changed, this is accompanied with an inert gas supply condition. However, also in this case, change of the inert gas supply port and the shower plate only need to be performed.

Now, a processing procedure in the above device for atomic layer deposition 10 will be described.

Figure 6:
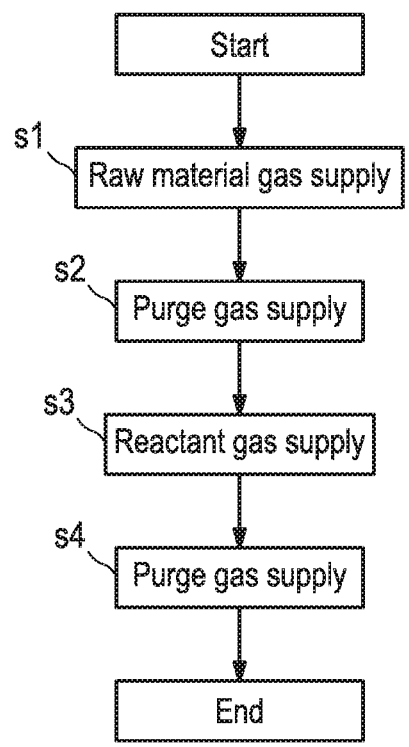
FIG. 6 is a flowchart illustrating an example of the atomic layer deposition method of the embodiment of the present invention.

FIG. 6 is a flowchart illustrating an example of an atom layer deposition method of this embodiment. FIGS. 7A to 7D each is a view illustrating a process of forming a thin film on a substrate S.

Figure 7A:
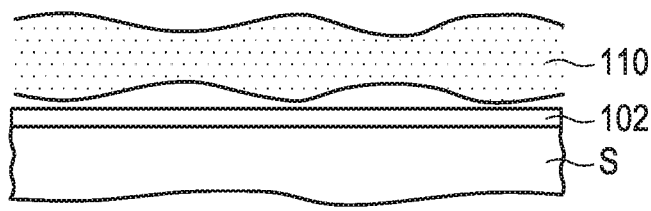
FIG. 7A, FIG. 7B, FIG. 7C, and FIG. 7D each is a view illustrating a process of forming a thin film on a substrate similarly.

First, a raw material gas supply section supplies raw material gas into the film deposition chamber 11 (Step s1). Specifically, the raw material gas supply section supplies the raw material gas into the gas introduction section 20. The raw material gas is supplied into the film deposition chamber 11. The raw material gas is supplied into the film deposition chamber 11 for, for example, 0.1 seconds. As illustrated in FIG. 7A, raw material gas 110 is supplied into the film deposition chamber 11 through Step s1, and the raw material gas 110 is adsorbed on the substrate S, so that an adsorption layer 102 is formed.

In Step s1, inert gas is supplied to an inner surface of the injector 21 and an outer surface of the injector adhesion preventive member 22. In the exhaust section 30, inert gas is supplied also to the exhaust adhesion preventive member 31 and the exhaust piping connection section 32. Furthermore, inert gas is supplied also to the susceptor peripheral edge 16B.

In this embodiment, not only in Step s1, but also in below described Steps s2 to s4, the inert gas is always supplied. Therefore, in Step s1, when the raw material gas is supplied into the film deposition chamber 11, it is possible to suppress entry of the raw material gas into a clearance between the film deposition chamber 11 and the injector adhesion preventive member 22, a clearance between the film deposition chamber 11 and the exhaust adhesion preventive member 31, and a clearance between the mask 56 and the susceptor 16.

Next, the supply of the raw material gas is stopped, and purge gas is supplied in the gas introduction section (Step s2). The purge gas is supplied into the film deposition chamber 11. The raw material gas is exhausted from the exhaust section 30 to the outside of the film deposition chamber 11.

Figure 7B:
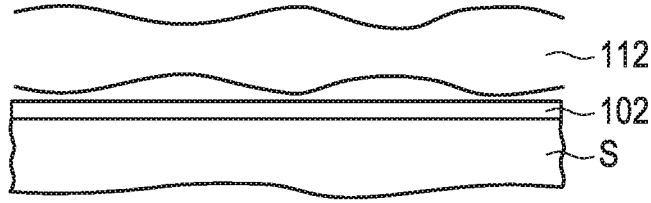

The purge gas is supplied into the film deposition chamber 11 for, for example, 0.1 seconds. The exhaust section 30 exhausts the raw material gas 110 and the purge gas 112 in the film deposition chamber 11. The exhaust section 30 exhausts the raw material gas 110 and the purge gas 112 in the film deposition chamber 11 for, for example, 2 seconds. As illustrated in FIG. 7B, through Step s2, the purge gas 112 is supplied into the film deposition chamber 11, and the raw material gas 110 that is not adsorbed on the substrate S is purged from the film deposition chamber 11.

Figure 7C:
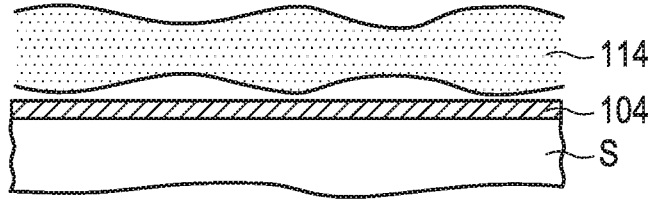

Next, reactant gas is supplied into the film deposition chamber 11 (Step s3). Specifically, the reactant gas is supplied through the gas introduction section 20. The reactant gas passes through a path of the gas introduction section 20 to be supplied into the film deposition chamber 11. The reactant gas is supplied into the film deposition chamber 11 for, for example, 1 second. As illustrated in FIG. 7C, reactant gas 114 is supplied into the film deposition chamber 11 through Step s3.

Also in Step s3, inert gas is supplied to the inner surface of the injector 21 and the outer surface of the injector adhesion preventive member 22, the exhaust section 30, and the susceptor peripheral edge 16B. Therefore, in Step s3, when reactant gas is supplied into the film deposition chamber 11, it is possible to suppress entry of the reactant gas into the clearance between the film deposition chamber 11 and the injector adhesion preventive member 22, the clearance between the film deposition chamber 11 and the exhaust adhesion preventive member 31, and the clearance between the mask 56 and the susceptor 16.

Figure 7D:
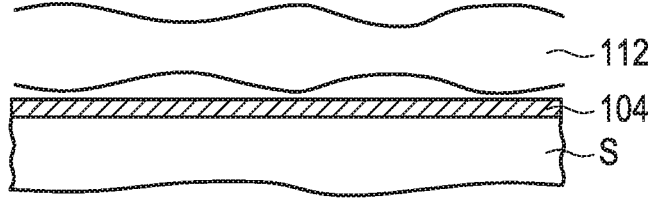

Next, the supply of the reactant gas is stopped, and purge gas is supplied to the gas introduction section 20 (Step s4). The purge gas is supplied into the film deposition chamber 11. The purge gas is exhausted from the exhaust section 30 to the outside of the film deposition chamber 11. The purge gas is supplied into the film deposition chamber 11 for, for example, 0.1 seconds. The exhaust section 30 exhausts the reactant gas 114 and the purge gas 112 in the film deposition chamber 11. As illustrated in FIG. 7D, through Step s4, the purge gas 112 is supplied into the film deposition chamber 11, and the reactant gas 114 is purged from the film deposition chamber 11.

Through Steps s1 to s4 described above, a thin film layer 104 which is an atom layer is formed on the substrate S. Hereinafter, Steps s1 to s4 are repeated a predetermined number of times, so that it is possible to form the thin film layer 104 having a desired film thickness.

In the device for atomic layer deposition 10 of this embodiment, the inert gas flows through the inner surface of the injector 21 and the outer surface of the injector adhesion preventive member 22, and therefore it is possible to suppress entry of the raw material gas and the reactant gas into the clearance between the film deposition chamber 11 and the injector 21. Therefore, it is possible to suppress adhesion of the thin film to the clearance between the film deposition chamber 11 and the injector 21. Similarly, adhesion of the thin film to the exhaust section 30 is prevented.

Furthermore, the inert gas flows out at the susceptor peripheral edge 16B, and therefore film adhesion to a bottom surface of the mask, a side surface of the substrate, a bottom surface of the substrate, the susceptor, and the like is prevented.

Additionally, for example, an alumina film formed by using TMA as the raw material gas and $O_3$ as the reactant gas is subjected to gas etching by $BCl_3$ gas. In order to perform gas etching of the alumina film by $BCl_3$ gas, for example, heating to a high temperature of about 500° C. is required.

A heater (not illustrated) is provided in the stage 14, and an inner wall of the film deposition chamber 11 located at the vicinity of the heater can be heated to a high temperature of about 500° C. by the heater. Therefore, the thin film adhered on the inner wall of the film deposition chamber 11 located in the vicinity of the heater can be removed by gas etching.

As described above, according to this embodiment, it is possible to suppress adhesion of the thin film on the inner wall of the film deposition chamber 11, the susceptor, and the like, and the thin film adhered on the inner wall and the susceptor can be removed by gas etching, and therefore it is possible to reduce the frequency of cleaning by wet etching.

Example 1

An AlON thin film was formed on a G2 glass substrate of 370 mm×470 mm by using the device for atomic layer depositions illustrated in FIG. 1 and FIG. 4. Various values of the device for atomic layer depositions are as follows:
a: 1 mm
b: 20 mm
shower hole diameter: 1 mm
shower pitch: 100 mm
stage temperature: 100° C.
inert gas temperature: 100°
inert gas flow rate: 500 sccm TMA (trimethylaluminum) was used as a liquid raw material (Al source), and oxygen plasma and nitrogen plasma were used as the reactant gas. The sequence illustrated in FIG. 6 was employed for the film deposition. Film deposition chamber internal pressure was set to 100 Pa, and nitrogen of 500 sccm was supplied from the inert gas supply section, and was always supplied during the film deposition sequence.

After deposition of a film of 20 μm was performed, the film adhesion amount to the lower surface of the mask 56 and the upper surface of the susceptor adhesion preventive plate 19A were visually observed. An interference film by a thin film was not observed, and it was confirmed that the film amount was 50 nm or less. Accordingly, it was confirmed that it has been possible to reduce the cleaning frequency of the mask and the susceptor with a structure to easily cope with change in substrate size and a process condition.

Thus, the present invention was described on the basis of the above embodiments. However, suitable change of the embodiments can be made without departing from the scope of the invention.

This application claims the Conventional priority based on Japanese patent application no. 2015-106856 filed on May 26, 2015, all of which described in this application is incorporated for reference.

REFERENCE SIGNS LIST 10 device for atomic layer deposition
11 film deposition chamber
13 substrate 14 stage
15 high frequency power supply
16 susceptor
16A susceptor body
16B susceptor peripheral edge
19 susceptor adhesion preventive plate
19A susceptor adhesion preventive plate
20 gas introduction section
30 exhaust section
40 mask pin holes
46 inert gas supply tube
47 inert gas supply path
48 inert gas supply port
49 shower plate
49A blow-off hole
50 inert gas supply port
50A blow-off hole
51 shower plate
56 mask
S substrate
102 adsorption layer
104 thin film layer
110 raw material gas
112 purge gas
114 reactant gas

The invention claimed is:

1. A device for atomic layer deposition that forms a thin film on a substrate, the device for atomic layer deposition comprising:
a film deposition chamber;
a stage that is installed inside the film deposition chamber;
a susceptor that holds, on the stage, the substrate;
a mask that is disposed on the substrate, the mask being sized to encompass the substrate;
a mask pin that supports the mask, and is movable upward and downward; and
a mask pin hole that is bored through the stage and the susceptor in a vertical direction, and allows the mask pin to be inserted in movable up and down manner, wherein:
the susceptor has a susceptor body having a holding surface of the substrate, and a susceptor peripheral edge located around the susceptor body, the susceptor peripheral edge having a height lower than the holding surface,
the mask pin hole is opened in the susceptor peripheral edge, and
in the susceptor peripheral edge, an inert gas supply port that releases gas upward is provided around the holding surface in a surrounding area of the mask, and an inert gas supply path for supplying inert gas is connected to the inert gas supply port.

2. The device for atomic layer deposition according to claim 1, wherein the inert gas supply port is provided outward from the mask pin hole with respect to the susceptor body.

3. The device for atomic layer deposition according to claim 1, wherein the inert gas supply port is formed at a plurality of places along an entire circumference around the holding surface or continuously formed over the entire circumference.

4. The device for atomic layer deposition according to claim 1, wherein the inert gas supply port has a shower head structure for the inert gas supply path.

5. The device for atomic layer deposition according to claim 1, wherein a clearance formed between the mask and the susceptor peripheral edge is not less than 0.1 mm and not more than 10 mm.

6. The device for atomic layer deposition according to claim 1, wherein a distance between a peripheral end of the mask and an adjacent side of the inert gas supply port is not less than 1 mm and not more than 200 mm.

7. The device for atomic layer deposition according to claim 1, wherein an adhesion preventive member is installed on an upper surface of the susceptor peripheral edge.

8. The device for atomic layer deposition according to claim 1, wherein the inert gas having a temperature within ±10% of a stage surface temperature is released from the inert gas supply port.

* * * * *